(12) United States Patent
J

(10) Patent No.: US 11,646,699 B2
(45) Date of Patent: May 9, 2023

(54) BIASING TECHNIQUE FOR AN OPERATIONAL AMPLIFIER

(71) Applicant: Texas Instruments Incorporated, Dallas, TX (US)

(72) Inventor: Vishnuvardhan Reddy J, Secunderabad (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/872,631

(22) Filed: Jul. 25, 2022

(65) Prior Publication Data

US 2023/0006613 A1 Jan. 5, 2023

Related U.S. Application Data

(63) Continuation of application No. 17/363,312, filed on Jun. 30, 2021, now Pat. No. 11,418,154.

(51) Int. Cl.
*H03F 1/32* (2006.01)
*H03F 3/45* (2006.01)

(52) U.S. Cl.
CPC ....... *H03F 1/3211* (2013.01); *H03F 3/45269* (2013.01)

(58) Field of Classification Search
CPC .................................................. H03F 1/3211
See application file for complete search history.

(56) References Cited

U.S. PATENT DOCUMENTS

| | | | |
|---|---|---|---|
| 5,856,757 A | 1/1999 | Eschauzier | |
| 5,963,053 A * | 10/1999 | Manohar | H03K 19/018528 326/82 |
| 6,531,919 B1 * | 3/2003 | Carter | H03F 3/45291 330/252 |
| 7,443,237 B1 * | 10/2008 | Liu | H03F 3/45192 330/253 |
| 9,722,555 B1 * | 8/2017 | Nagulapalli | H03F 3/45183 |
| 2004/0258183 A1 | 12/2004 | Popescu et al. | |
| 2006/0132239 A1 | 6/2006 | Kelly et al. | |
| 2008/0079492 A1 | 4/2008 | Kobayashi et al. | |
| 2011/0115561 A1 | 5/2011 | Kumar et al. | |
| 2013/0106515 A1 | 5/2013 | Lin | |
| 2014/0029143 A1 * | 1/2014 | Lim | H03F 1/523 330/261 |
| 2014/0111278 A1 | 4/2014 | Coimbra et al. | |
| 2014/0176239 A1 | 6/2014 | Duggal | |

(Continued)

*Primary Examiner* — Patricia T Nguyen
(74) *Attorney, Agent, or Firm* — Charles F. Koch; Frank D. Cimino

(57) ABSTRACT

A circuit includes first through fourth transistors and a device. The first transistor has a control input and first and second current terminals. The control input provides a first input to the circuit. The second transistor has a control input and first and second current terminals. The control input provides a second input to the circuit. The third transistor has a control input and first and second current terminals. The fourth transistor has a control input and first and second current terminals. The second current terminal of the fourth transistor is coupled to the second current terminal of the third transistor, and the control input of the fourth transistor is coupled to the first current terminals of the first and second transistors. The device is configured to provide a fixed voltage to the control input of the third transistor.

20 Claims, 2 Drawing Sheets

(56) References Cited

U.S. PATENT DOCUMENTS

2015/0349734 A1* 12/2015 Lee .................... H03F 3/45188
    330/260
2019/0173442 A1* 6/2019 Segarra ................ H03F 3/4565

* cited by examiner

BIASING TECHNIQUE FOR AN OPERATIONAL AMPLIFIER

CROSS-REFERENCE TO RELATED APPLICATIONS

This application is a continuation of U.S. patent application Ser. No. 17/363,312 filed on Jun. 30, 2021, which is hereby incorporated by reference.

BACKGROUND

Numerous types of circuits include operational amplifiers (op amps). Examples of such circuits include comparators (in which an op amp is in an open loop configuration) and amplifier circuits (in which an op amp is in a closed loop configuration). An operational amplifier includes multiple transistors and operates from a supply voltage. A manufacturer of an operational amplifier specifies a parameter referred to as the input common-mode voltage range. The input common-mode voltage range is a range of input voltages that results in proper operation of the operational amplifier. That is, the operational amplifier remains in the intended (linear) region of operation. Having a wide range of common mode for an op amp is useful for achieving a target linearity for amplification over a wide range of input voltage.

SUMMARY

In at least one example, a circuit includes first through fourth transistors and a device. The first transistor has a control input and first and second current terminals. The control input provides a first input to the circuit. The second transistor has a control input and first and second current terminals. The control input provides a second input to the circuit. The third transistor has a control input and first and second current terminals. The fourth transistor has a control input and first and second current terminals. The second current terminal of the fourth transistor is coupled to the second current terminal of the third transistor, and the control input of the fourth transistor is coupled to the first current terminals of the first and second transistors. The device is configured to provide a fixed voltage to the control input of the third transistor.

BRIEF DESCRIPTION OF THE DRAWINGS

For a detailed description of various examples, reference will now be made to the accompanying drawings in which.

DETAILED DESCRIPTION

Figure 1:
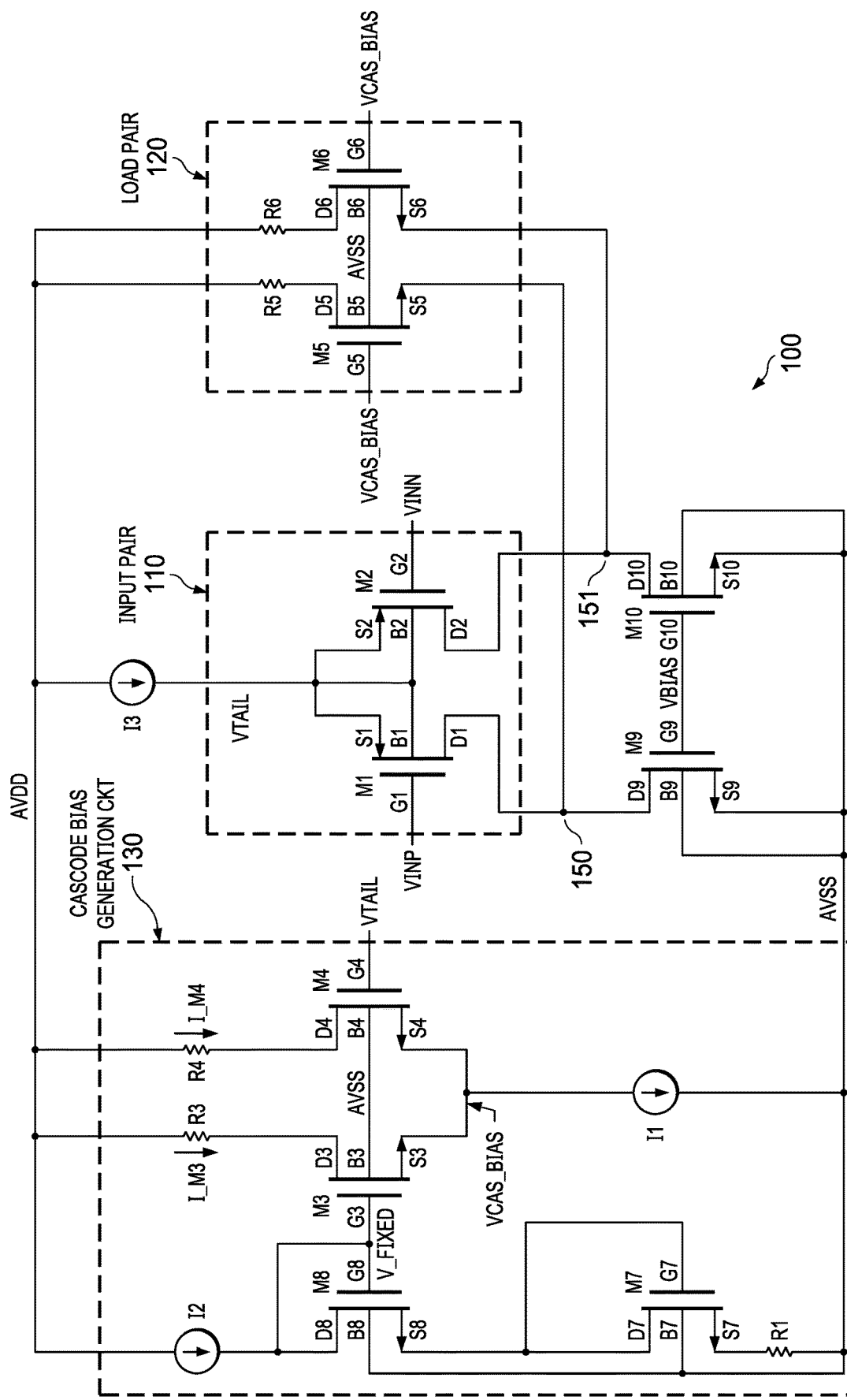
FIG. 1 shows an example of an input stage for an operational amplifier.

As explained above, the input voltages to an op amp must adhere to the specified input common-mode voltage range for that device in order for the op amp to operate according to other parameters such as gain and bandwidth. It may be desirable to have a wider, rather than a narrower, input common-mode voltage range. Each transistor included in an op amp is rated for a certain voltage. The voltage rating of a transistor defines the maximum voltage difference that can exist across any pair of terminals (e.g., source-to-drain, gate-to-source, gate-to-drain, body-to-drain, etc.). For example, a 1.8V transistor is one in which the voltage difference between any two of its terminals (e.g., gate, drain, source, and body) should not exceed 1.8V (or should not exceed the voltage rating plus a small margin of, for example, 10%). A voltage applied between a pair of terminals exceeding the rating may result in gate oxide stress, channel hot carrier (CHC) degradation, and may result in a catastrophic failure of the device.

For applications, such as comparators and amplifiers, it may be desirable to use lower voltage transistors (e.g., 1.8V transistors) for the op amp's input stage in order for the comparator or amplifier to achieve better performance. For example, the delay time of a comparator represents the amount of time between the signal on an input crossing the reference level on the other input and the output signal from the comparator changing state. Lower voltage input stage transistors for the op amp input pair may help the comparator achieve a lower delay than if higher voltage transistors were used in the input stage. Unfortunately, using a lower voltage device (e.g., 1.8V) with a substantially higher supply voltage (e.g., 3.3V) presents challenges in terms of ensuring reliability of the device if an adequate biasing scheme is not incorporated. That is, to ensure that the voltage between any pair of terminals for the input stage does not exceed the rating for the transistors. Without a proper biasing scheme, the input voltage to the op amp (input common mode) may need to be limited to a narrower range of voltages. However, if higher voltage transistors are used to resolve the reliability problem, they will limit the other parameters of the comparator such as common mode (common mode reduces with higher voltage transistors as the higher voltage devices have higher threshold voltages), delay, and offset. Hence, there is a tradeoff between performance and reliability of the circuit. The embodiments described herein are directed to an input stage for an op amp that uses lower voltage transistors while also having a relatively large input common-mode voltage range without fewer or no reliability issues even while operating the circuit at higher supply voltages. For the biasing scheme described herein at least some of the transistors in the op amp's input stage (e.g., the input pair) are rated for voltages significantly lower than the supply voltage. For example, the supply voltage may be 3.3 V but the rating on the transistors in the op amp's input stage may be 1.8V. The embodiments described herein ensure that, despite a relatively large range of input common-mode voltages and despite the supply voltages being higher than the maximum rated value for the lower voltage transistors (e.g., the input pair), the op amp's input stage transistors will not receive a voltage difference across any pair of their terminals in excess of the voltage rating of the transistors while supporting the common mode of, for example, 0V to 2.1V.

FIG. 1 shows an example of at least a portion of an input stage 100 of an op amp. The input stage includes an input pair of transistors 110, a load pair of transistors 120, and a cascode bias generation circuit 130. In addition to other components, the input stage 100 includes transistors M1-M10. The input pair of transistors includes transistors M1 and M2. The load pair of transistors 120 includes transistors M5 and M6. The cascode bias generation circuit 130 includes transistors M3, M4, M7 and M8. In the example of FIG. 1, transistors M1-M10 are metal oxide semiconductor field effect transistors (MOSFETs), but can be other types of transistors (e.g., bipolar junction transistors) in other implementations. A transistor has a control input and a pair of current terminals. A MOSFET's control and current terminals are its gate, source, and drain, respectively. A MOSFET also may have a body (substrate) terminal. A bipolar junction transistor's control and current terminals are its base, emitter, and collector, respectively.

Transistors M1 and M2 in the example of FIG. 1 are P-type MOSFETs. The gates of transistors M1 and M2 represent the inputs of the op amp. The gate of transistor M1 is designated VINP, and the gate of transistor M2 is designated VINN. The average voltages on the gates of transistors M1 and M2 are referred to as the common-mode voltages. The source S1 of transistor M1 is coupled to the source S2 of transistor M2. The body B1 of transistor M1 is coupled to the body B2 of transistor M2 and to the sources S1 and S2. The positive power supply terminal is designated AVDD, and the negative power supply terminal is designated AVSS. A current source device I3 is coupled between AVDD and the sources S1 and S2 of transistors M1 and M2. The fixed current source I3 provides a tail current which divides between transistors M1 and M2. The current I3 generally divides evenly between transistors M1 and M2 if the gate-to-source voltage (Vgs) of transistor M1 is equal to the Vgs of transistor M2. However, if transistors M1 and M2 have unequal Vgs voltages, more than half of I3 will flow through the transistor that has the higher Vgs. The voltage on the sources S1 and S2 is designated VTAIL.

Transistors M9 and M10 in the example of FIG. 1 are N-type MOSFETs. The drain D9 of transistor M9 is coupled to the drain D1 of transistor M1 at a terminal labeled 150. The drain D10 of transistor M10 is coupled to the drain D2 of transistor M2 at a terminal labeled 151. The gates G9 and G10 of transistors M9 and M10, respectively, are coupled together and to a bias voltage VBIAS. The voltage level of bias voltage VBIAS is such that transistors M9 and M10 operate in their saturation region. The body B9 and the source S9 of transistor M9 is coupled the AVSS. The body B10 and the source S10 of transistor M10 also is coupled the AVSS.

For the load pair of transistors 120, transistors M5 and M6 are N-type MOSFETs in the example of FIG. 1. The body B5 of transistor M5 is coupled to the body B6 of transistor M6 and to AVSS. A resistor R5 is coupled between AVDD and the drain D5 of transistor M5, and a resistor R6 is coupled between AVDD and the drain D6 of transistor M6. The source S5 of transistor M5 is coupled to the drain D1 of transistor M1 at terminal 150, and the source S6 of transistor M6 is coupled to the drain D2 of transistor M2 at terminal 151. The input pair of transistors 110 is coupled to the load pair of transistors 120 in a folded cascode configuration.

Within the cascode bias generation circuit 130, transistors M3, M4, M7, and M8 are N-type MOSFETs. In addition to transistors M3, M4, M7, and M8, the cascode bias generation circuit 130 includes current source devices I1 and I2 and resistors R1, R3, and R4. The body B3 of transistor M3 is coupled to the body B4 of transistor M4 and to AVSS. Resistor R3 is coupled between AVDD and the drain D3 of transistor M3. Resistor R4 is coupled between AVDD and the drain D4 of transistor M4. The source S3 of transistor M3 is coupled to the source S4 of transistor M4. Current source I1 is coupled between the sources S3 and S4 of transistors M3 and M4, respectively, and AVSS as shown. The voltage on the sources S3 and S4 of transistors M3 and M4 is designated VCAS_BIAS, and is provided to the gate G5 of transistor M5 and to the gate G6 of transistor M6.

The source S8 of transistor M8 is coupled to the drain D7 and gate G7 of transistor M7. The body B8 of transistor M8 and the body B7 of transistor M7 are coupled together and to AVSS. The gate G7 of transistor M7 is coupled to its drain D7. Similarly, the gate G8 of transistor M8 is coupled to its drain D8. Accordingly, transistors M7 and M8 are configured as diode-connected transistors and that, when on, each transistor M7, M8 generates a voltage on its drain with respect to its source is equal to a diode voltage drop (e.g., a voltage in the range of 0.5V to 0.7V) with bias current I2 flowing through them. In other embodiments, diodes are used in place of diode-connected transistors. Resistor R1 is coupled between the source S7 of transistor M7 and AVSS. Diode-connected transistors M7 and M8 are coupled in series with resistor R1 between current source device I2 and AVSS. The voltage difference across resistor R1 is equal to the product of the resistance of resistor R1 and the magnitude of the current produced by current source I2 (I2*R1). The voltage on the drain D8 (and thus the gate G8) of transistor M8 is equal to the voltage drop across resistor R1 plus the sum of the drain-to-source voltage drops across diode-connected transistors M7 and M8. That voltage is a fixed voltage (and is labeled V_FIXED) because of the fixed voltage across resistor R1, and the generally fixed voltage drop developed across each of the diode-connected transistors M7 and M8.

Accordingly, the gate G3 of transistor M3 is biased at a fixed voltage, V_FIXED. The gate G4 of transistor M4 is coupled to the sources S1 and S2 of transistors M1 and M2, and thus receives the voltage VTAIL. The voltage VCAS_BIAS generated by the cascode bias generation circuit 130 is used to bias the gates of transistors M5 and M6. The voltage on the sources S5 and S6 of transistors M5 and M6 is approximately the Vgs (Vgs is equal to the threshold voltage, VT, plus the overdrive voltage, Vov) below the voltage on the gates G5 and G6. That is, the voltage on the source S5 is one Vgs (of M5) below the voltage on the gate G5, and the voltage on the source S6 is one Vgs (of M6) below the voltage on the gate G6. The threshold voltages of transistors M5 and M6 are approximately the same in one embodiment. Because the gates G5 and G6 of transistors M5 and M6 receive the same bias voltage, VCAS_BIAS, the voltage on the drain D1 of transistor M1 will be approximately the same as the voltage on the drain D2 of transistor M2 at the common mode input, which is VCAS_BIAS minus the Vgs of transistors M5, M6. This means that the drain voltage on transistors M1/M9 and M2/M10 is a function of the voltage VCAS_BIAS, which is generated by the cascode bias generation circuit 130.

The voltage VTAIL is the voltage on the sources S1 and S2 of transistors M1 and M2. The voltage VTAIL at the common mode input is approximately one Vgs of P-type MOSFET transistors M1/M2 above the voltage on their gate. With VINP and VINN having approximately the same voltage (common mode), the voltage VTAIL is one Vgs above the voltage present on VINP or VINN. As the voltage on VINP, VINN (common mode) increases, the voltage VTAIL also increases, and as the voltage on VINP, VINN decreases, the voltage VTAIL also decreases.

The current through resistor R3 and transistor M3 is designated as I_M3, and the current through resistor R4 and transistor M4 is designated as I_M4. At low enough levels of the voltage VTAIL that the voltage on the gate G4 of transistor M4 is below its source voltage, VCAS_BIAS, transistor M4 will be off, and the full I1 current will flow through transistor M3 (I_M3 will be equal to I1). The voltage on the gate of transistor M3 is a fixed voltage, V_FIXED (decided by I*R plus the two diode voltage drop from transistors M7 and M8), and thus the source voltage of transistor M3/M4 remains constant. As the input voltage of VINP, VINN increases, the voltage VTAIL also increases and remains one Vgs above the voltage of VINP or VINN. As the voltage VTAIL increases but is still less than one Vgs (of M4) above the VCAS_BIAS, transistor M4 will remain off, and I_M3 will be equal to I1.

As the voltage VTAIL continues to increase, eventually, the voltage VTAIL on the gate G4 of transistor M4 will be high enough that it will be more than one Vth above the voltage on its source S4 (VCAS_BIAS). At that point, current I_M4 will begin to flow through transistor M4. As the gate voltage (VTAIL) of transistor M4 continues to increase and thus current I_M4 increases, in order for the sum of I_M3 and I_M4 to remain equal to fixed current I1, the current I_M3 must decrease. Because the gate voltage of transistor M3 is fixed, for I_M3 to decrease the voltage on the source S3 of transistor M3 increases. Thus, once VTAIL is large enough to turn on transistor M4, the voltage VCAS_BIAS increases as the voltage VTAIL increases.

When transistor M4 is off, the voltage VCAS_BIAS is one Vgs (of transistor M3) below V_FIXED. Further, the voltage on the drains D1 and D2 of transistors M1 and M2 is one Vgs (of transistors M5, M6) below the gate voltage of transistors M5 and M6 (VCAS_BIAS). Thus, the voltage on drains D1 and D2 is two Vgs drops below V_FIXED (one Vgs is the Vgs of M3 and the other Vgs is the Vgs of M5, M6). Because of this two-Vgs drop, two series-connected, in this example, diode-connected transistors M7 and M8 are included in series with resistor R1, to generate the voltage V_FIXED. V_FIXED, as explained above, is two Vgs voltages above the voltage (I2*R1) across resistor R1. Accordingly, when transistor M4 is off, the voltage on drains D1 and D2 is approximately equal to I2*R1.

As explained above, the voltage VCAS_BIAS, which through transistors M5 and M6 dictates the voltage (VCAS_BIAS minus Vgs of M5, M6) on the drains D1 and D2 of transistors M1/M9 and M2/M10, is controlled by the voltage V_FIXED when the input common-mode voltage on VINP and VINN is relatively low (low enough that transistor M4 is off). At relatively low common-mode voltages, the voltage VCAS_BIAS is at a fixed level (approximately one Vgs voltage below V_FIXED as explained above). Voltage V_FIXED is approximately equal to the sum of the voltage drop across resistor R1 and the voltage drops across the diode-connected transistors M7 and M8. The level of VCAS_BIAS can be set by selection of the magnitude of the current source device I2 and the resistance of resistor R2. The magnitude of the current source device I2 and the resistance of resistor R2 are chosen such that, at low levels of the input common mode voltage, VCAS_BIAS will be a sufficiently high voltage to ensure sufficient Vds margins for the input pair M1, M2 and M9, M10 devices. The Vgs of transistors M1 and M2 is generally maintained slightly above the one threshold voltage (e.g., 0.75V) throughout the range of common-mode voltages. The bodies B1 and B2 are connected to their respective sources S1 and S2, and thus the drain-to-body and gate-to-body voltages are protected in the same way that the Vds and Vgs voltages are protected from exceeding the voltage rating of the transistors.

However, as the input common-mode voltage VINP, VINN reaches and exceeds a high enough level to cause transistor M4 to begin to conduct current I_M4, the voltage VCAS_BIAS increases with increases in the input common-mode voltage. With VCAS_BIAS increasing with increases in common-mode voltage, the voltage on the drains D1 and D2 of transistors also increases (the drain voltages are approximately one Vgs (of M5, M6) below VCAS_BIAS). By causing the drain voltages of transistors M1 and M2 to increase with increases in the common-mode voltages on the gates G1 and G2, the Vgd and Vds continues to be less than the voltage rating of the transistors even at higher levels of common-mode voltage.

The voltage drop across any pair of terminals for transistors M9 and M10 also remains less than the voltage rating of transistors M9 and M10. The sources S9 and S10 are connected to AVSS, and the level of VBIAS for the gates G9 and G10 is low enough to ensure that the Vgs of transistors M9 and M10 is less than the voltage rating. Transistors M3 and M4 (lower threshold voltage devices) and transistors M5 and M6 (higher threshold voltage devices) are sized such that at higher common levels, VCAS_BIAS minus Vgs of M5/M6 will be low enough such that the voltage on the drain of transistors M9 and M10 will not be greater than its rated voltage. VCAS_BIAS is equal to VTAIL minus the relatively low value of the Vgs of transistor M4. Accordingly, the voltage on the drains D1 and D2 of transistors M1 and M2 and the on the drains D9 and D10 of transistors M9 and M10 is VCAS_BIAS minus the higher level of Vgs of transistors M5 and M6, and hence will be lower than the rated voltage of transistors M9 and M10.

Figure 2:
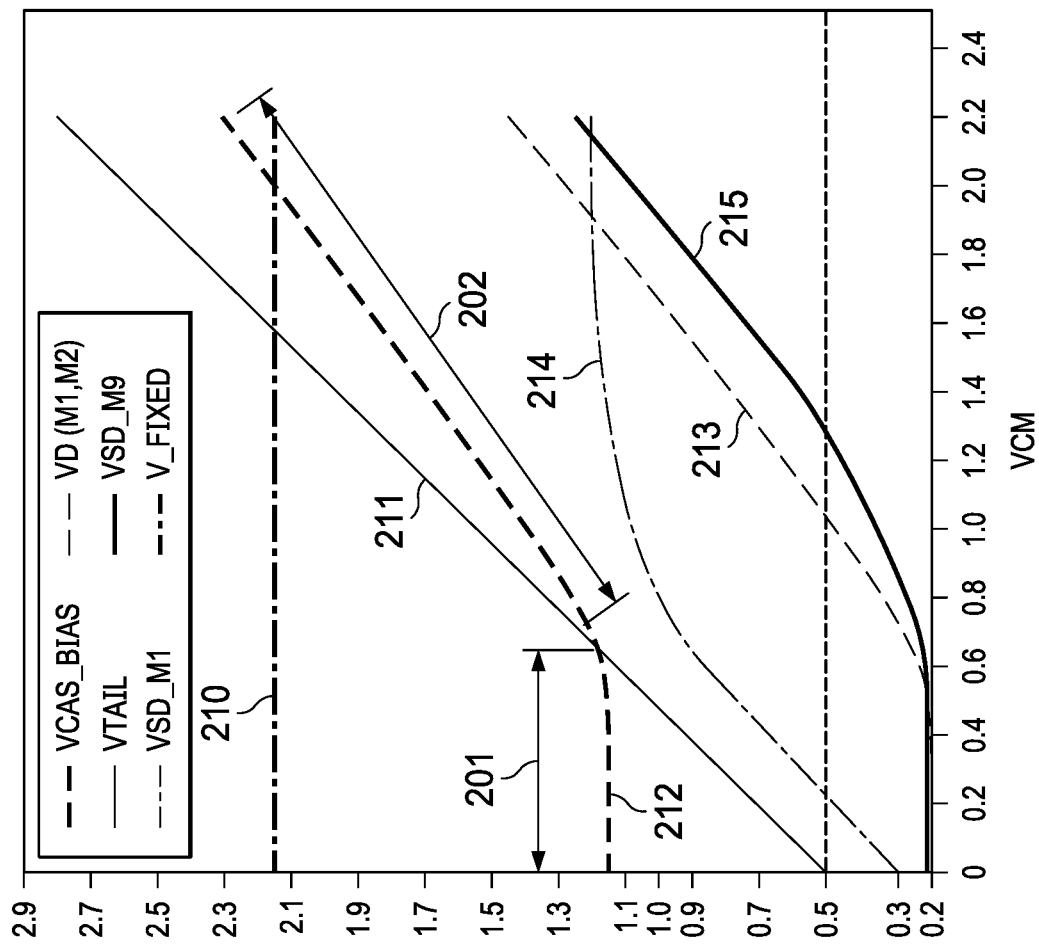
FIG. 2 shows curves depicting various voltages within the operational amplifier's input stage.

In one example, the voltage rating of transistors M1, M2, M9, and M10 within the op amp's input stage 100 is 1.8V, but the power supply voltage (AVDD) is in the range of 2.9 V to 3.6 V. FIG. 2 shows various voltages within the op amp's input stage 100 for a range (X-axis) of common-mode voltage (VCM) from 0V to 2.2V. The voltage curves shown in FIG. 2 include V_FIXED 210, VTAIL 211, VCAS_BIAS 212, the drain voltage (VD) 213 of transistors M1 (which also is the drain voltage of transistor M9) and M2 (which also is the drain voltage of transistor M10), the source-to-drain voltage 214 of transistor M1 (VSD_M1), and the source-to-drain voltage 215 of transistor M9 (VSD_M9), which is the same as the source-to-drain voltage of transistor M10). Voltage V_FIXED 210 is shown as a fixed voltage of approximately 2.15 V in this example. As explained above, this voltage V_FIXED is a function of the Vgs of transistors M7 and M8, resistor R1 and the magnitude of current source device I2 (the sum of I2*R1, the Vgs of M7, and the Vgs of M8. Voltage VTAIL 211 is function of VCM, and thus linearly increases as a function of VCM. Voltage VCAS_BIAS 212 is relatively flat in region 201 in which VTAIL 211 is not large enough to turn on transistor M4, and thus VCAS_BIAS 212 (approximately 1.15 V in region 201 is maintained at a level that is one Vgs (of transistor M3) below the voltage V_FIXED.

In this example, as VCM increases, at approximately a VCM of 0.6 V, VCM is high enough that VTAIL 211 also is high enough to begin to turn on transistor M4. As VCM increases from that point forward (above 0.6 V), VCAS_BIAS 212 increases with increases in VTAIL 211.

Within the illustrative region 201 (low common-mode voltage), the common-mode voltage of VINP, VINN on the gates G1 and G2 of transistors M1, M2 is in the range of 0 to 0.6 V. The voltage (VD, 213) on the drains D1, D2 of transistors M1, M2 is one Vgs (of M5, M6) below VCAS_BIAS 212 and is shown in the example of FIG. 2 at approximately 0.2 V in region 201. Accordingly, the gate-to-drain voltage of transistors M1 and M2 in region 201 (VCM minus VD of M1, M2) is less than approximately 0.4 V, and thus well within a voltage rating of, for example, 1.8V.

The voltage VTAIL 211 on the sources S1 and S2 of transistors M1 and M2 remains approximately one Vgs (of M1, M2) above the common-mode voltages on the gates G1 and G2. Accordingly, the Vgs of transistors M1 and M2 remains slightly more than one Vth, well below the voltage rating of the transistors (e.g., 1.8V). Because the bodies B1 and B2 of transistors M1 and M2 are connected to their sources, the gate-to-body voltages of transistors M1 and M2 are the same as the Vgs voltages, which are within the voltage rating of the transistors.

For the source-to-drain voltage of transistors M1, and M2, the source voltage is VTAIL 211 and the drain voltage is VD. The voltage VTAIL 211 is less than 1.2 V in region 201 and VD is 0.2, and thus the source-to-drain voltage (VDS_M1) is well below the voltage rating (e.g., 1.8 V). Because the bodies B1 and B2 of transistors M1 and M2 are connected to their sources, the body-to-drain voltage of transistors M1 and M2 is the same as the source-to-drain voltage, that is, less than the voltage rating of the transistor.

Transistors M9 and M10 have their sources S9 and S10 connected to AVSS. The bias voltage VBIAS for the gates of transistors M9 and M19 is low enough to ensure that the Vgs of transistors M9 and M10 is below the voltage rating of transistors M9 and M10 The resistance of resistor R1 and the magnitude of the current from current source I2 are chosen such that I2*R1 at lower common mode voltages (which is the voltage on the drains D9 and D10 of transistors M9 and M10) provides sufficient Vds margin for transistors M1, M2, M9 and M10, Transistors M3, M4, M5, and M6 are designed such that, at higher common mode voltages, the drain voltages of transistors M9 and M10 will not exceed their maximum voltage rating. Sufficient Vds margin is also provided for transistors M1 and M2. That is, VDS_M9/VDS_M10 remains below the voltage rating of 1.8V as shown in FIG. 2. The voltage on the drains D9 and D10 is approximately 0.2V for lower common mode as shown and reaches a maximum level of approximately 1.35V as the input common mode increases to 2.1V. As Vds is protected, Vdg (drain to gate voltage) will be protected for any finite value of VBIAS.

In region 202, VCM is large enough to turn on transistor M4 and, as explained above, VCAS_BIAS 212 increases with increases in VCM as shown. VCM is the voltage on the gates of transistors M1 and M2, and VCAS_BIAS minus Vfs of transistors M5/M6 is the voltage on their drains. Accordingly, the gate-to-drain voltage on transistors M1 and M2 remains below the voltage rating of the transistors M1.

The embodiment of FIG. 1 includes PMOS and NMOS transistors as shown. An alternative embodiment includes a reciprocal circuit from that shown in FIG. 1 in which NMOS transistors replace the PMOS transistors and PMOS transistors replace the NMOS transistors.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A circuit, comprising:
  a first transistor having a control input and first and second current terminals, the control input providing a first input to the circuit;
  a second transistor having a control input and first and second current terminals, the control input providing a second input to the circuit;
  a third transistor having a control input and first and second current terminals;
  a fourth transistor having a control input and first and second current terminals, the second current terminal of the fourth transistor is coupled to the second current terminal of the third transistor, and the control input of the fourth transistor is coupled to the first current terminals of the first and second transistors; and
  a device configured to provide a fixed voltage to the control input of the third transistor.

2. The circuit of claim 1, further comprising:
  a fifth transistor having a control input and first and second current terminals, the control input of the fifth transistor is coupled to the second current terminals of the third and fourth transistors;
  a sixth transistor having a control input and first and second current terminals, the control input of the sixth transistor is coupled to the second current terminals of the third and fourth transistors.

3. The circuit of claim 2, wherein the second current terminal of the fifth transistor is coupled to the second current terminal of the first transistor, and the second current terminal of the sixth transistor is coupled to the second current terminal of the second transistor.

4. The circuit of claim 2, wherein the third and fourth transistors are metal oxide semiconductor field effect transistors, and the second current terminals of the third and fourth transistors are sources of the respective third and fourth transistors.

5. The circuit of claim 1, further including a current source device coupled between the first current terminals of the first and second transistors and a voltage supply or ground terminal.

6. The circuit of claim 1, wherein the device is a fifth transistor and is a diode-connected transistor, and the circuit further includes:
  a sixth device; and
  a resistor;
  wherein the fifth transistor, sixth device, and resistor are coupled in series.

7. The circuit of claim 6, wherein the sixth device is a diode.

8. The circuit of claim 6, wherein the sixth device is a diode-connected transistor.

9. The circuit of claim 6, wherein the fifth transistor has a control input that is coupled to the control input of the third transistor.

10. A circuit, comprising:
  a first transistor having a control input and first and second current terminals, the control input providing a first input to the circuit;
  a second transistor having a control input and first and second current terminals, the control input providing a second input to the circuit, the first current terminals of the first and second transistors are coupled together;
  a third transistor having a control input and first and second current terminals, the second current terminal of the third transistor is coupled to the second current terminal of the first transistor;
  a fourth transistor having a control input and first and second current terminals, the second current terminal of the fourth transistor is coupled to the second current terminal of the second transistor; and a bias generation circuit configured to generate a bias voltage for the control inputs of the third and fourth transistors that is based on:
   a fixed voltage at a lower level of voltages on the control inputs of the first and second transistors; and
   a voltage of the first current terminals of the first and second transistors at a higher level of voltages on the control inputs of the first and second transistors.

11. The circuit of claim 10, wherein the bias generation circuit comprises:
   a fifth transistor having a control input and first and second current terminals;
   a sixth transistor having a control input and first and second current terminals, the second current terminal of the sixth transistor is coupled to the second current terminal of the fifth transistor, and the control input of the sixth transistor is coupled to the first current terminals of the first and second transistors; and
   a fixed voltage circuit coupled to the control input of the fifth transistor.

12. The circuit of claim 11, wherein the second current terminals of the fifth and sixth transistors are coupled to the control inputs of the third and fourth transistors.

13. The circuit of claim 11, wherein the fifth and sixth transistors comprise metal oxide semiconductor field effect transistors (MOSFETs), and the second current terminals of the fifth and sixth transistors are sources of the respective MOSFETs.

14. The circuit of claim 11, wherein the fixed voltage circuit comprises a resistor and multiple diode-connected transistors in series, one of the diode-connected transistors having a control input that is coupled to the control input of the fifth transistor.

15. A circuit, comprising:
   a first transistor having a control input and first and second current terminals, the control input providing a first input to the circuit;
   a second transistor having a control input and first and second current terminals, the control input providing a second input to the circuit, the first current terminals of the first and second transistors are coupled together;
   a third transistor having a control input and first and second current terminals, the second current terminal of the third transistor is coupled to the second current terminal of the first transistor;
   a fourth transistor having a control input and first and second current terminals, the second current terminal of the fourth transistor is coupled to the second current terminal of the second transistor; and
   a bias generation circuit configured to:
      generate a fixed voltage; and
      generate a bias voltage for the control inputs of the third and fourth transistors responsive to the magnitude of the fixed voltage relative to a voltage on the first current terminals of the first and second transistors.

16. The circuit of claim 15, wherein the bias generation circuit comprises:
   a fifth transistor having a control input and first and second current terminals;
   a sixth transistor having a control input and first and second current terminals, the second current terminal of the sixth transistor is coupled to the second current terminal of the fifth transistor, and the control input of the sixth transistor is coupled to the first current terminals of the first and second transistors; and
   a fixed voltage circuit coupled to the control input of the fifth transistor, the fixed voltage circuit is configured to generate the fixed voltage.

17. The circuit of claim 16, wherein the second current terminals of the fifth and sixth transistors are coupled to the control inputs of the third and fourth transistors.

18. The circuit of claim 16, wherein the fifth and sixth transistors comprise metal oxide semiconductor field effect transistors (MOSFETs), and the second current terminals of the fifth and sixth transistors are sources of the respective MOSFETs.

19. The circuit of claim 16, wherein the fixed voltage circuit comprises a resistor and multiple diodes coupled in series.

20. The circuit of claim 19, wherein at least one of the diodes is a diode-connected transistor having a control input that is coupled to the control input of the fifth transistor.

\* \* \* \* \*